United States Patent [19]

Kawashima

[11] Patent Number: 4,525,646
[45] Date of Patent: Jun. 25, 1985

[54] FLEXURAL MODE VIBRATOR FORMED OF LITHIUM TANTALATE

[75] Inventor: Hirofumi Kawashima, Tokyo, Japan

[73] Assignee: Seiko Instruments & Electronics, Ltd., Tokyo, Japan

[21] Appl. No.: 87,716

[22] Filed: Oct. 24, 1979

Related U.S. Application Data

[63] Continuation of Ser. No. 883,256, Mar. 3, 1978, abandoned.

[30] Foreign Application Priority Data

Mar. 22, 1977 [JP] Japan ................................. 52-31423

[51] Int. Cl.³ ............................................. H01L 41/08
[52] U.S. Cl. .................................... 310/360; 310/366; 310/370
[58] Field of Search ............... 310/360, 361, 370, 366, 310/367

[56] References Cited

U.S. PATENT DOCUMENTS

| 2,081,405 | 5/1937 | Mason | 310/370 X |
|---|---|---|---|
| 3,601,639 | 8/1971 | Hannon | 310/360 |
| 3,944,862 | 3/1976 | Shimoi | 310/370 X |
| 3,969,640 | 7/1976 | Staudte | 310/370 X |
| 4,035,673 | 7/1977 | Ishida et al. | 310/370 X |
| 4,173,726 | 11/1979 | Hanji | 310/370 X |
| 4,178,566 | 12/1979 | Kawashima | 310/370 X |

FOREIGN PATENT DOCUMENTS 2277438 of 0000 France ............................... 310/370

Primary Examiner—Mark O. Budd
Attorney, Agent, or Firm—Robert E. Burns; Emmanuel J. Lobato; Bruce L. Adams

[57] ABSTRACT

A lithium tantalate (LiTaO$_3$) vibrator comprises a lithium tantalate crystal vibratable in the flexural mode and having an electro-mechanical coupling factor within the range 0.04 to 0.10. The crystal may have a tuning fork shape cut from a Z-plate turned an angle of 48° to 55° around the X-axis.

24 Claims, 12 Drawing Figures

FIG. 1
FIG. 2
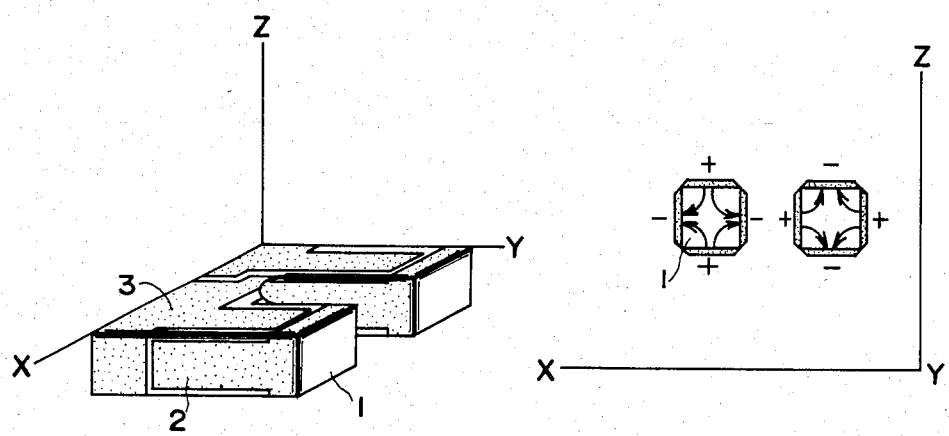
FIG. 3
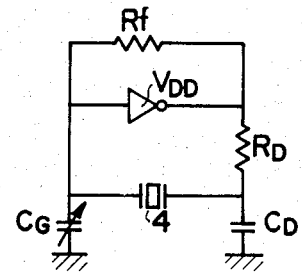
FIG. 4
FIG. 5
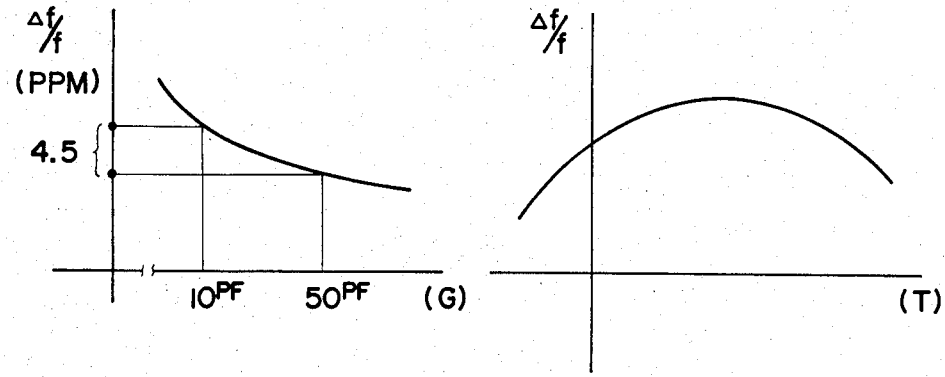

FLEXURAL MODE VIBRATOR FORMED OF LITHIUM TANTALATE

This is a continuation of application Ser. No. 883,256, filed Mar. 3, 1978, now abandoned.

BACKGROUND OF THE INVENTION

This invention relates to a lithium tantalate vibrator of the flexural mode type for use as a time standard in electronic timepieces, and more particularly this invention relates to the electro-mechanical coupling factor and cutting-out angle of such a vibrator.

The primary object of this invention is to provide a lithium tantalate vibrator of the flexural mode type having high stability which is achieved by improving the electro-mechanical coupling factor thereof.

Another object of this invention besides the above improvement is to provide a lithium tantalate vibrator of the flexural mode type having high stability and also superior temperature characteristics by suitably selecting the cut-out angle thereof.

Presently, quartz crystals are used in general as the piezo-electric vibrators for electronic timepieces such as watches. The reason is that the quartz crystal forms a single crystal having a very small amount of impurity and high chemical stability. But it is disadvantageous for use as a vibrator for watches due to the relatively small electro-mechanical coupling factor of quartz crystal. In general, the electro-mechanical coupling factor "k" of the quartz crystal vibrators of flexural mode the in present use has been small, on the order of approximately 0.04, and the curve of the capacity-resonance frequency variation is a gently sloping one.

BRIEF DESCRIPTION OF THE DRAWINGS

FIG. 1 shows a perspective view of a prior art flexural mode quartz crystal vibrator of tuning fork type;

FIG. 2 shows the electrode structure of the vibrator shown in the FIG. 1;

FIG. 3 is a diagram of the oscillating circuit using the vibrator of FIGS. 1 and 2;

FIG. 4 is a diagram of the tunability when the electro-mechanical coupling factor of the prior art quartz crystal vibrator of tuning fork type is 0.04;

FIG. 5 shows a diagram of the temperature characteristics of the prior art quartz crystal vibrator of tuning fork type;

DESCRIPTION OF PRIOR ART

Figure 6:
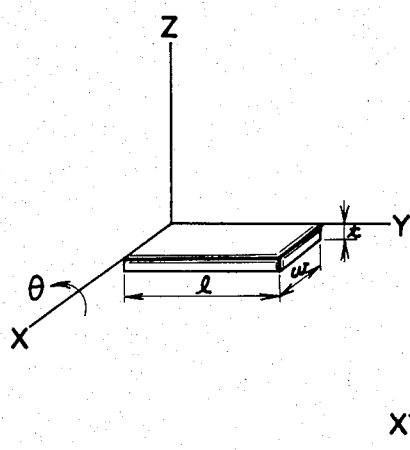
FIG. 6 is an explanatory view of a LiTaO$_3$ vibrator according to this invention and which will be used to explain the theory of operation.

FIG. 1 is a perspective view of a typical prior art quartz crystal vibrator of flexural mode type presently in use comprising a quartz crystal vibrator "1" formed into a tuning fork shape and having exictation electrodes "2" and "3" on the front, rear and side surfaces thereof. The X-axis, Y-axis and Z-axis thereof are respectively the electric axis, mechanical axis and optical axis of the vibrator. FIG. 2 shows the sectional view of the quartz crystal vibrator of FIG. 1 and shows by arrows the direction of the electric field when negative voltage is applied to the electrode "2" and positive voltage to the electrode "3" on the arms of tuning fork. The component of the electric field necessary for exciting the quartz vibrator is that which extends in the X-axis direction, so that the X-axis component of the electric field becomes the largest at the side surfaces of the tuning fork arms. But the X-axis electric field component becomes proportionately smaller in value as it approaches the center portion of the tuning fork arms and becomes zero in value at the center thereof, however the energy for exciting the tuning fork arms is small in practice. When the quartz crystal vibrator having the electrode construction shown in FIG. 2 is excited, the electro-mechanical coupling factor "k" thereof is approximately 0.04 which is very small in comparison with that of the other piezo-electric materials.

FIG. 3 shows a C-MOS IC oscillating circuit V$_{DD}$ incorporating a quartz crystal vibrator of tuning fork type, and a feedback resistance "R$_5$" and the quartz crystal vibrator "4" are connected between the gate and drain electrodes of the oscillating circuit V$_{DD}$. A variable capacitor "C$_G$" C$_G$ is connected to the gate electrode and a resistance "R$_D$" and a capacitor "C$_D$" are connected in series to the drain electrode and both of the capacitors are connected to the low voltage terminal of the electric power source.

FIG. 4 shows the variation of the resonance frequency of the quartz crystal vibrator of tuning fork type in a case wherein the electro-mechanical coupling factor "k" thereof is about 0.04 in the oscillating circuit shown in FIG. 3. (This value is called "tunability" hereafter).

The tunability of quartz crystal vibrators of the tuning fork type for watches in present use varies about 4.5 PPM (the variation of the resonance frequency) when the capacitor "C$_G$" changes from 10 PF to 50 PF. However this degree of variation is small for watch vibrators, and though it is desired that the fabricated quartz crystal vibrators have the same resonance frequency. In practice they exhibit a considerable fluctuation so that to obtain the necessary resonance frequency it is necessary to selectively adjust the frequency by the variable capacitor "C$_G$". Further, there is a practical point beyond which quartz crystal vibrators having small tunability though a large range of resonance frequency fluctuation can not be set to the required resonance frequency. For this reason, the tunability range should preferably be larger to a certain degree.

FIG. 5 shows a temperature-resonance frequency curve of a prior art type tuning fork type quartz crystal vibrator and which is an upward quadratic convex curve and the quadratic temperature coefficient thereof is about −0.045 PPM/°C.$^2$ (negative value) which is relatively larger than that of other vibrating modes. The quadratic temperature coefficient is theoretically known to be the smallest when the direction of the tuning fork arm is placed such that its length is parallel with the Y-axis, its thickness parallel with the Z-axis at the Z-plate. And this value is approximately $-0.045$ PPM/°C.$^2$ as shown in the FIG. 5.

DETAILED DESCRIPTION OF PREFERRED EMBODIMENTS

This invention uses a piezo-electric crystal, that is, lithium tantalate, and effectively solves the above drawbacks by improving the cut-out angle and the electrode construction. And also this invention has found the most suitable cutting angle to achieve better temperature characteristics by means of studying for the linear ($\alpha$) and quadratic ($\beta$) temperature coefficients by analyzing theoretically the temperature-resonance frequency characteristics. Further this invention provides the optimum tunability according to the size of the vibrator.

Hereafter, this invention will be described in accordance with FIGS. 6–12 of the drawings.

FIG. 6 shows the crystal axes of a $LiTaO_3$ single crystal in which X, Y and Z are respectively the electric, mechanical and optical axes. It is considered that a flexural $LiTaO_3$ vibrator of bar type as shown in the FIG. 6 is cut out, that is to say, this vibrator has its length "l" parallel with the Y-axis, its thickness "t" parallel with the Z-axis and its width "w" parallel with the X-axis.

When this vibrator is driven so as to flexurally vibrate, the equation of its vibrating frequency is as follows:

$$f = \frac{m^2}{2\pi \cdot 2\sqrt{3}} \frac{W}{l^2} \sqrt{\frac{E}{\rho}} \sqrt{I} \quad (1)$$

on condition that $$I = \left\{ 1 + \frac{1}{3}\left(\frac{mw}{2l}\right)^2 \left(1 + \frac{1}{k_1} S_{44}E\right) \right\}^{-1}$$

wherein m: constant, W: width, l: length, E: elastic stiffness, $\rho$: density, $k_1$: Constant and $S_{44}$: elastic compliance.

The frequency f(T) of the flexural $LiTaO_3$ vibrator, at any temperature such as, for example, at room temperature of 25° C., is shown by the quadratic approximation with Taylor's expansion as follows:

$$f(T) = F(25)[1 + \alpha(T - 25) + \beta(T - 25)^2] \quad (2)$$

wherein $\alpha$ and $\beta$ are the temperature coefficients of linear and quadratic frequencies and are defined as follows:

$$\alpha = \left[ \frac{\partial f(T)}{\partial T} \right] 25/f(25) \quad (3)$$

$$\beta = \left[ \frac{\partial^2 f(T)}{\partial T^2} \right] 25/[2f(25)] \quad (4)$$

and can be transferred by the equation (1) as follows:

$$\dot{\alpha} = \frac{1}{2}\left(\frac{\dot{E}}{E} - \frac{\dot{\rho}}{\rho} + \frac{\dot{I}}{I}\right) + \frac{\dot{W}}{W} - 2\frac{\dot{l}}{l} \quad (5)$$

wherein the dot mark depicts the temperature differential calculus $(\dot{\ } \equiv \partial/\partial T)$. $(\dot{\ } \equiv \partial/\partial T)$. And the following values are given in equation (5).

$$\frac{\dot{\rho}}{\rho} = -\left(\frac{\dot{X}}{X} + \frac{\dot{Y}}{Y} + \frac{\dot{Z}}{Z}\right),$$

$$\frac{\dot{W}}{W} = (1 - N_1^2)\frac{\dot{X}}{X} + N_1^2 \frac{\dot{Z}}{Z},$$

$$\frac{\dot{l}}{l} = (1 - N_2^2)\frac{\dot{X}}{X} + N_2^2 \frac{\dot{Z}}{Z},$$

$$\frac{\dot{I}}{I} = 2(I - 1)\frac{\dot{W}}{W} - 2(I - 1)\frac{\dot{l}}{l} - \left(1 - I - \frac{m^2}{12} I \frac{W^2}{l}\right)$$

$$\frac{\dot{S}_{44}}{S_{44}} - \left(1 - I - \frac{m^2}{12} I \frac{W^2}{l}\right) \frac{\dot{E}}{E}$$

wherein $$\frac{\dot{x}}{x}, \frac{\dot{y}}{y} \text{ and } \frac{\dot{z}}{z}$$

are respectively the linear expansion coefficients along the X-axis, Y-axis and Z-axis, and when the vibrator rotates an angle $\theta$ degrees around the X-axis, the following temperature coefficient values $\alpha$ show that $N_2 = \sin \theta$ and $N_1 = 0$, therefore the coefficient $\alpha$ can be selected at any optional angle of $\theta$ degrees, and also the value of the coefficient $\beta$ can be perfectly chosen by the same method.

By the calculating technique of this invention, the cutting angle $\theta$ which is needed to get $\alpha = 0$ at the sides-dimensional ratio $W/l = 0.12$ of the vibrator is located within the range of about 51.19°–51.21° and in this case the value of $\beta$ shows about $4.8 \times 10^{-8}$/°C.$^2$. And the cutting angle $\theta$ needed to get $\alpha = 0$ become proportionately larger in order to make the sides-dimensional ratio $W/l$ gradually smaller and thereby the value of $\beta$ tends to be also smaller. Conversely, if the sides-dimensional ratio $W/l$ becomes larger, the cutting angle $\theta$ needed to get $\alpha = 0$ becomes smaller and the value of $\beta$ becomes larger. Further, in this calculation of approximation under the condition wherein the ratio $W/l = 0$, the cutting angle $\theta$ needed to get $\alpha = 0$ is located in the range of about 51.95°–51.97° and the value of $\beta$ under the same condition is $4.1 \times 10^{-8}$/°C.$^2$.

When the maximum (upper limits) of frequency, size and temperature characteristics able to be used for electronic watches are taken into consideration, the cutting angle of the $LiTaO_3$ vibrator is limited within the range of about 48°–55°. The above theoretical analysis is described in regard to a free-free type (both ends free) vibrator, but apply also to the cantilever type wherein (I=0).

Figure 7:
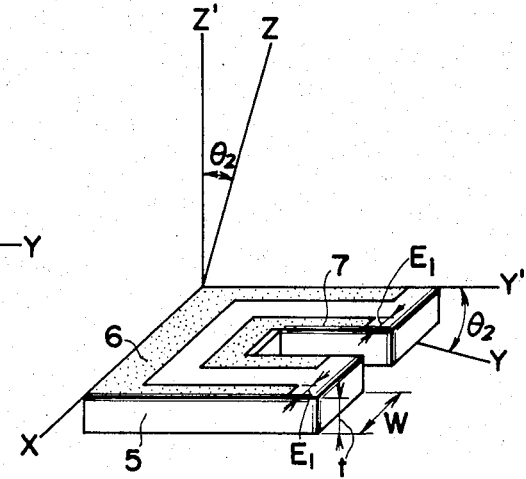
FIG. 7 is a perspective view of one embodiment of LiTaO$_3$ vibrator of tuning fork type according to this inventions.

FIG. 7 shows a perspective view of one embodiment of the $LiTaO_3$ vibrator of tuning fork type according to the invention wherein "5" is a $LiTaO_3$ vibrator of tuning fork shape, "6" is one exciting electrode and "7" is the other exciting electrode (similar exciting electrodes also exist on the rear side surface thereof but they are not shown in the figure). The "l" shows the length of the tuning fork arms, the "t" the thickness thereof and the "$E_1$" the width of the electrodes. And the cutting angle $\theta$ thereof is selected within the range of about 48°–55° as shown by the theoretical analysis.

Figure 8:
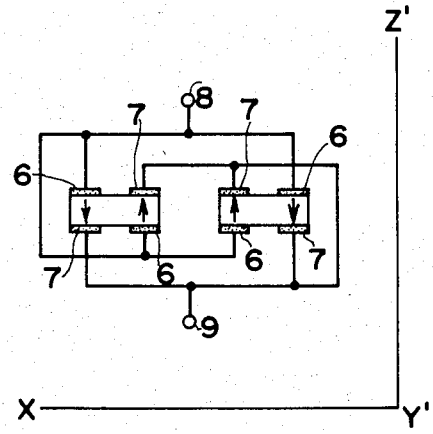
FIG. 8 is a sectional view thereof showing the electrode structure.

FIG. 8 shows the structure of the electrodes of the LiTaO$_3$ vibrator of tuning fork type, and "8" and "9" are electrode terminals.

Now, if a positive potential is applied to the terminal "8" and a negative potential applied to the terminal "9", electric fields are created in the arrow marked directions, and considering one of the tuning fork arms, the directions of the components of the electric field "Y'−Z'" go in the opposite directions symetrically with respect to the center of the arm so that the left half thereof produces expansion strain and the right half thereof reversely produces contraction strain, the arms can be caused to bend. So if alternate electric potentials are applied to the electrode terminals "8" and "9", the vibrations of the LiTaO$_3$ vibrator of tuning fork type can easily be continued or sustained.

Figure 9:
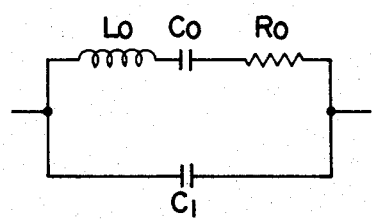
FIG. 9 is an equivalent circuit of the LiTaO vibrator shown in FIG. 7.

FIG. 9 shows the equivalent circuit of the LiTaO$_3$ vibrator of tuning fork type wherein "$L_0$" is the motional inductance, "$C_0$" is the motional capacitance, "$R_0$" is the crystal impedance and "$C_1$" is the capacitor between the two terminals. The relation between the shape and the "$L_0$" of the electrodes shown in the FIG. 7 is as follows:

$$L_0 \propto \frac{tl^3}{W^3} \tag{6}$$

That is, "$L_0$" is in inverse proportion to the cube of the width of the tuning fork arm "W", in proportion to the cube of the length "l" thereof and also in proportion to the thickness "t" thereof. By this result, the "$L_0$" can become larger by making "W" smaller, that is, in other words, the capacitance ratio "$C_1/C_0$" can be made larger. Further the following relation exists between the capacitance ratio "$C_1/C_0$" and the electro-mechanical coupling factor "k":

$$\frac{C_1}{C_0} = \frac{\pi^2}{8}\left(\frac{1-k^2}{k^2}\right) \tag{7}$$

By the equations (6) and (7), the electro-mechanical coupling factor "k" can easily be changed by changing the "W".

Figure 10:
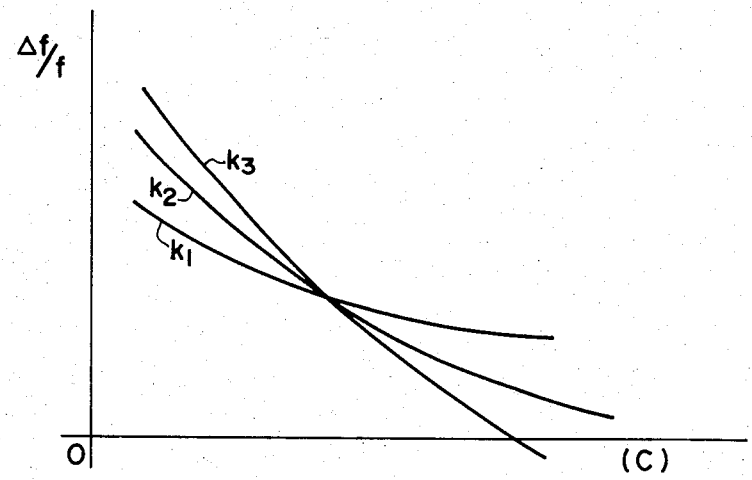
FIG. 10 is a diagram of the tunability of the LiTaO$_3$ vibrator of flexural mode type according to this invention.

FIG. 10 shows several capacity-resonance frequency variation curves (the tunability) for several "k" values ($k_1 < k_2 < k_3$ and shows that the variations of the frequencies per unit capacity become larger according to larger "k" values. As seen in FIG. 10, within the same capacity range and as compared to quartz crystal (SiO$_2$), the larger the value of the coupling factor "k" the larger the frequency variations and consequently, the more unstable the ocillations. This invention has solved the above problem by making the electro-mechanical coupling factor "k" of the LiTaO$_3$ vibrator smaller than has heretofore been the case with the present state-of-the-art LiTaO$_3$ vibrators to thereby obtain stable oscillations. That is to say, for vibrators for use in electronic watches, the electro-mechanical coupling factor "k" of the LiTaO$_3$ vibrator can maintain the stable oscillation thereof by making the coupling factor "k" within the range of 0.04 to 0.1 (4%–10%). In accordance with this invention, the value of "k" can be satisfactorily obtained by adjusting the width of the tuning fork arms and in actual practice, arms under 0.5 mm in width can be realized. In the above method, the electro-mechanical coupling factor "k" has been improved by changing the dimensional size of the tuning fork arms, but it can also be improved by changing the exciting electrodes of the tuning fork arms.

In FIG. 7, the crystal impedance "$R_0$" becomes higher in value as the widths of the exciting electrodes "$E_1$" are made gradually smaller. The relation between said impedance "$R_0$" and said coupling factor "k" is $R_0 \propto 1/k^2$, therefore the coupling factor "k" can be made smaller according to making the width "$E_l$" of the electrodes smaller. It has been found that the said coupling factor "k" can turn to be within the range of 0.04 to 0.1 (4%–10%) by making the width "$E_1$" of the electrodes under one-third of the width "W" of the corresponding tuning fork arm.

Figure 11:
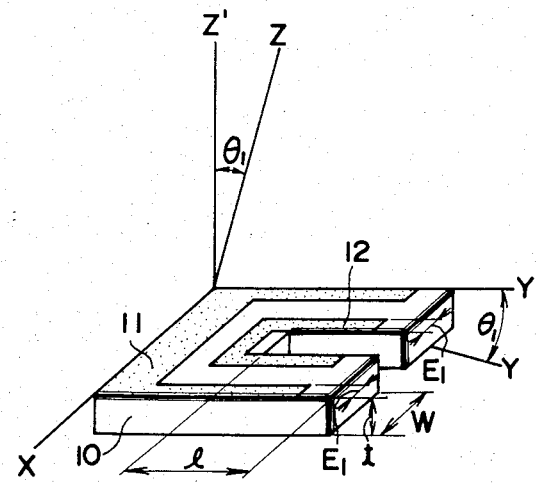
FIG. 11 shows a perspective view of another embodiment of flexural LiTaO$_3$ vibrator according to this invention.

FIG. 11 shows the perspective view of another embodiment of the LiTaO$_3$ vibrator of tuning fork type wherein "10" is a LiTaO$_3$ vibrator of tuning fork type, "11" is one side exciting electrode, "12" is the other exciting electrode (the electrodes on the other side not being shown in the figure), and further the cutting angle "$\theta$" is selected in the range of about 48° to 55°.

Figure 12:
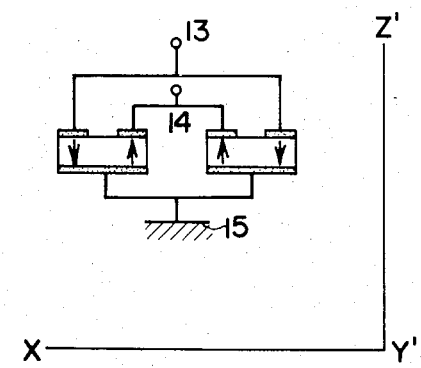
FIG. 12 is a sectional view showing the electrode structure of the flexural mode LiTaO$_3$ vibrator tuning fork of FIG. 11.

FIG. 12 shows the structure of the LiTaO$_3$ vibrator of tuning fork shape in which "13" and "14" are respectively the terminals of the electrodes and "15" is the grounded electrode. So, there are three electrodes which cause the electro-mechanical coupling factor "k" to be small by making the intensity of the electric field small, and also as mentioned above, the optimum electro-mechanical factor can be obtained by means of keeping the width "W" under 0.5 mm and the width of the electrode "$E_1$" within one-third that of said "W".

And the LiTaO$_3$ vibrator of the invention can be easily fabricated with a strong alkali solution, so that the vibrator has superior properties even though made very small in size and dimension.

As described above, this invention enables formation of a lithium tantalate (LiTaO$_3$) vibrator of the flexural mode type having temperature characteristics similar to or better that of quartz crystal vibrators and further, also enables formation of a super small sized lithium tantalate (LiTaO$_3$) vibrator of flexural mode type by making the quadratic temperature coefficient thereof smaller in accordance with the side dimension ratio W/l being made smaller. Furthermore, the LiTaO$_3$ vibrator can be made having a small electro-mechanical coupling factor by making the width of the tuning fork arms small or selecting the suitable width of the electrodes in relation to the width of the arms because of the considerably high value of the coupling factor of lithium tantalate compared to that of quartz crystal.

Therefore, the tunability satisfactory for use in electronic watches can be achieved, and the LiTaO$_3$ vibrator of flexural mode type having high stability can be obtained. Additionally, the LiTaO$_3$ vibrator of flexural mode type according to this invention can be made by chemical etching operations so that the vibration can be commercially produced at low cost.

What I claim:

1. A lithium tantalate vibrator for use as a time standard in electronic timepieces comprising: a lithium tantalate crystal having a shape effective to sustain flexural mode vibrations and having an electro-mechanical coupling factor within the range 0.04 to 0.10.

2. A lithium tantalate vibrator according to claim 1; wherein said crystal comprises a cut out Z-plate turned an angle of 48° to 55° around the X-axis.

3. A lithium tantalate vibrator according to claim 2; wherein said Z-plate has a tuning fork shape which includes at least two vibratable tuning fork arms.

4. A lithium tantalate vibrator according to claim 3; wherein the width of said tuning fork arms is greater than the thickness thereof and less than 0.5 mm.

5. A lithium tantalate vibrator according to claim 1; wherein the lithium tantalate crystal vibrator is formed by chemical etching.

6. A lithium tantalate vibrator according to claim 1; wherein said lithium tantalate crystal has a tuning fork shape including at least two vibratable tuning fork arms, a set of excitation electrodes disposed on opposite major faces of said tuning fork arms for exciting said arms into vibration in the flexural mode, and wherein the width of each electrode is less than one third the width of the arm on which it is disposed.

7. A lithium tantalate vibrator according to claim 1; wherein said lithium tantalate crystal has a tuning fork shape including at least two vibratable tuning fork arms, a set of excitation electrodes disposed on opposite major faces of said tuning fork arms for exciting said arms into vibration in the flexural mode, and wherein at least one major face of each tuning fork arm has disposed thereon a plurality of excitation electrodes.

8. A lithium tantalate vibrator according to claim 7; wherein both opposite faces of each tuning fork arm have two excitation electrodes disposed thereon in symmetrical relationship.

9. In an electronic timepiece: an oscillating circuit including a vibrator comprised of lithium tantalate crystal having a shape effective to sustain flexural mode vibrations and having an electro-mechanical coupling factor within the range of 0.04 to 0.10.

10. In an electronic timepiece according to claim 9; wherein said crystal comprises a cut out Z-plate turned an angle of 48° and 55° around the X-axis.

11. In an electronic timepiece according to claim 10; wherein said Z-plate has a tuning fork shape which includes at least two vibratable tuning fork arms.

12. In an electronic timepiece according to claim 11; wherein the width of said tuning fork arms is greater than the thickness thereof and less than 0.5 mm.

13. In an electronic timepiece according to claim 9; wherein the lithium tantalate crystal vibrator is formed by chemical etching.

14. In an electronic timepiece according to claim 9; wherein said lithium tantalate crystal has a tuning fork shape including at least two vibratable tuning fork arms, a set of excitation electrodes disposed on opposite major faces of said tuning fork arms for exciting said arms into vibration in the flexural mode, and wherein the width of each electrode is less than one third the width of the arm on which it is disposed.

15. In an electronic timepiece according to claim 9; wherein said lithium tantalate crystal has a tuning fork shape including at least two vibratable tuning fork arms, a set of excitation electrodes disposed on opposite major faces of said tuning fork arms for exciting said arms into vibration in the flexural mode, and wherein at least one major face of each tuning fork has disposed thereon a plurality of excitation electrodes.

16. In an electronic timepiece according to claim 15; wherein both opposite faces of each tuning fork arm have two excitation electrodes disposed thereon in symmetrical relationship.

17. A lithium tantalate vibrator according to claim 6; wherein each of the two opposite major faces of each vibratable tuning fork arm has two excitation electrodes disposed lengthwise thereon, the width of each excitation electrode being less than one third the width of the arm on which it is disposed.

18. A lithium tantalate vibrator according to claim 7; wherein said one major face of each vibratable tuning fork arm has two excitation electrodes disposed lengthwise thereon, the width of each of said two excitation electrodes being less than one third the width of the arm on which is is disposed.

19. A lithium tantalate vibrator according to claim 18; wherein the other major face of each vibratable tuning fork arm has a single excitation electrode disposed lengthwise thereon.

20. A lithium tantalate vibrator according to any of claims 17, 18 or 19; wherein the width of said vibratable tuning fork arms is less than 0.5 mm.

21. In an electronic timepiece according to claim 14; wherein each of the two opposite major faces of each vibratable tuning fork arm has two excitation electrodes disposed lengthwise thereon, the width of each excitation electrode being less than one third the width of the arm on which it is disposed.

22. In an electronic timepiece according to claim 15; wherein said one major face of each vibratable tuning fork arm has two excitation electrodes disposed lengthwise thereon, the width of each of said two excitation electrodes being less than one third the width of the arm on which it is disposed.

23. In an electronic timepiece according to claim 22; wherein the other major face of each vibratable tuning fork arm has a single excitation electrode disposed lengthwise thereon.

24. In an electronic timepiece according to any of claims 22, 23 or 24; wherein the width of said vibratable tuning fork arms is less than 0.5 mm.

* * * * *